(12) United States Patent
Liu et al.

(10) Patent No.: US 6,809,616 B2
(45) Date of Patent: Oct. 26, 2004

(54) INDUCTOR EQUIVALENT CIRCUIT AND APPLICATION THEREOF

(75) Inventors: Jing-Meng Liu, Hsinchu (TW); Kent Hwang, Taoyuan Hsien (TW); Chao-Hsuan Chuang, Hsinchu (TW); Cheng-Hsuan Fan, Hsinchu Hsien (TW)

(73) Assignee: Richtex Technology Corp., Hshinchu Hsien (TW)

( * ) Notice: Subject to any disclaimer, the term of this patent is extended or adjusted under 35 U.S.C. 154(b) by 72 days.

(21) Appl. No.: 10/342,183

(22) Filed: Jan. 15, 2003

(65) Prior Publication Data

US 2004/0008096 A1 Jan. 15, 2004

(30) Foreign Application Priority Data

Feb. 1, 2002 (TW) ........................................ 91101768 A

(51) Int. Cl.[7] .............................................. H03H 11/00
(52) U.S. Cl. ........................................ 333/214; 330/288
(58) Field of Search ................................ 333/213, 214, 333/216, 217; 330/253, 257, 277, 288

(56) References Cited

U.S. PATENT DOCUMENTS 4,654,602 A * 3/1987 Aoki .......................... 330/257
5,451,903 A * 9/1995 Armstrong .................. 330/263
5,461,343 A * 10/1995 Foran ......................... 330/288

FOREIGN PATENT DOCUMENTS

JP 7-303026 A * 11/1995 ........... H03H/11/04

* cited by examiner

Primary Examiner—Robert Pascal
Assistant Examiner—Dean Takaoka
(74) Attorney, Agent, or Firm—Troxell Law Office PLLC

(57) ABSTRACT

An inductor equivalent circuit is disclosed. The circuit comprises a reference current source, a first current mirror, a second current mirror, two operational amplifiers OP1 and OP2, a capacitor, a first transistor, a second transistor, a mirror resistor set, and a bypass current source in parallel with the capacitor. An input signal is through OP1 and second transistor to control the reference current source. The first mirror current is then feed-back a signal to the first transistor through an OP2. The current signal makes the drain current of the first transistor lags the input voltage signal by 90° due to the capacitor coupled with the first mirror current source. The mirror resistor set can be resistors having one common terminal grounded, and other terminals each, respectively, coupled with the first and the second transistor and the capacitor, or can be composed of transistors and all of them with gate property biased so that the transistors in the mirror resistor set are operated in an ohmic region. The second mirror current provides an output current of the inductor equivalent circuit for next cascade stage.

14 Claims, 4 Drawing Sheets

INDUCTOR EQUIVALENT CIRCUIT AND APPLICATION THEREOF

FIELD OF THE INVENTION

The present invention relates to a circuit used to simulate the electrical characteristics of an inductor, and more particularly, to utilize the inductor equivalent circuit to a tunable band pass filter and an oscillator circuit.

DESCRIPTION OF THE PRIOR ART

An analog circuit usually includes both active device and passive device. The former is typically a transistor, and the latter is usually composed of capacitor, inductor, and resistor. A filter having only components of one or more inductors, capacitors and resistors is called a passive filter. In recent decade, thin film semiconductor techniques for manufacturing the capacitor and the resistor have gained a great achievement. For example, integrating several millions of resistors, capacitors, and transistors in a chip having size of about a thumb isn't longer a difficult matter exclude inductors. To make a inductor without occupying large planar area by semiconductor integrated circuit (IC) is difficult. The inductor formed is usually by means of wire winding with very long metal wire for an inductor in reasonable inductance value so as to suit for applications and thus cause it impractical to integrate the inductors in IC chips for most applications.

Fortunately, active type filter has been developed recently. The circuit is composed of operational amplifiers, transistors, resistors, and capacitors without inductors. As a result, the filter can be shrinkage in size and integrated in IC chips. The active type filter is thus more suitable than the passive type filter to be built inside IC's. However, the characteristic of the operational amplifier itself restricted the frequency band width and the power consumption. Consequently, the active type filter is usually used in a range of lower frequency processing, for instance, audio band and below.

Liu, in U.S. Pat. No. 5,600,288 with a title "Synthetic Inductor in Integrated Circuits for Small Signal Processing" proposed a RLC circuit composed of a current mirror circuit incorporated with a plurality of transistors, a resistor and a capacitor to successively simulate an inductor. According to the circuit, inductances can be fabricated in a range between 100 $\mu$H to 100 mH and having a frequency response available to great 10 MHz.

The present invention is to provide another types of simulated inductor circuit, particularity using in band pass filter, for which the center frequency is tunable in a very easy way, furthermore, it can be easily cascaded to form high order filters, keeping the center frequency tunable and consistent.

SUMMARY OF THE INVENTION

The invention discloses an inductor equivalent circuit and its application in active filter. Five preferred embodiments are proposed.

In the first embodiment, the circuit comprises a reference current source, a current mirror, two operational amplifiers OP1 and OP2, a capacitor, a first transistor, a second transistor, a first resistor, a third transistor, and a current source in parallel with the capacitor. Two resistors have one common terminal grounded and other terminals are, respectively, coupled with the two transistors. An input signal is through OP1 and second transistor. The current mirror is then feed-back a signal to the first transistor through OP2. The signal makes the drain current of the first transistor lags the input voltage signal by 90° due to the capacitor coupled with the mirrored current source.

In the second preferred embodiment includes an extra terminal, the second mirror current, to provide an output current of the inductor equivalent circuit for a next cascade stage.

In the third preferred embodiment, the circuit comprises elements as in the second preferred embodiment, and an additional resistor which is coupled with the capacitor and ground to stabilize the circuit and also for applications with lower Q-values.

In the fourth preferred embodiment, the circuit is a simplify version of the circuit in the third preferred embodiment by skip OP1 and OP2. The resulting characteristics comparing with the circuit in the third preferred embodiment is slightly inferior in distortion, but having a wider applicable frequency range.

In the fifth preferred embodiment, all the resistors are replaced with a resistor mirror set, a plurality of transistors, with gates terminal thereof coupled with a biased signal. The biased signal is a proper voltage so that the resistor mirror set consisting of transistors is operated in an ohmic region. The gate bias of the transistors of the resistor mirror set can be modulated to set the equivalent resistance value of the transistors, thus to adjust the center frequency of the filter. Furthermore, a resistor mirror circuitry is also proposed to mirror the desired resistance value to the transistors of the resistor mirror set.

DESCRIPTION OF THE PREFERRED EMBODIMENTS

The present invention discloses an inductor equivalent circuit consisting of active devices, and passive devices, such as capacitors, and resistors. Five exemplary embodiments are included. A filter circuit composed of the inductor equivalent circuit, resistors, and capacitors is also disclosed. No solenoid or inductors made of physical wire winding are involved. The cascade filters can provide a very high quality of band-pass filter circuit.

Figure 1:
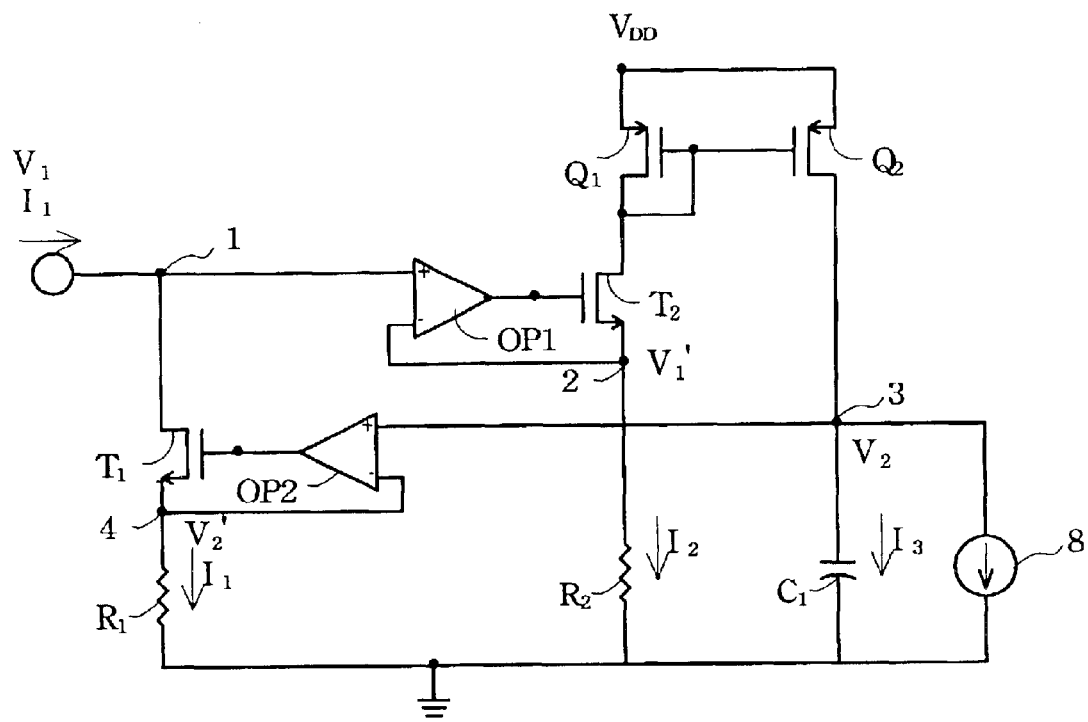
FIG. 1 shows a simulated inductor composed of active devices and passive devices in accordance with the first preferred embodiment of the present invention.

Please refer to FIG. 1, a synthetic inductor circuit consisting of a current mirror circuit having transistors $Q_1$ and $Q_2$, two voltage follower type operational amplifier OP1 and OP2, two transistors $T_1$ and $T_2$ and passive members such as resistors $R_1$, $R_2$ and a capacitor $C_1$ together with a shunt direct current source 8. The output terminals of the operational amplifier OP1 and OP2 are coupled with gates of two transistors $T_1$ and $T_2$, respectively. The input current $I_1$ comes after (or lag) the input voltage $V_1$ by $\pi/2$ radian (90°). Consequently, the circuit shown in FIG. 1 is an equivalent inductor.

The following is to set forth the embodiment. When a voltage signal $V_1$ inputs to the "+" terminal of the OP1, the output signal of the OP1 is then turn the transistor $T_2$ ON to have $V_1{}'$ follow $V_1$ and to provide a reference current $I_2$ flowing through the transistor $Q_1$ of the current mirror circuit. The current mirror circuit is composed of transistors $Q_1$, and $Q_2$ and with gates thereof connecting to a drain electrode of the transistor $Q_1$. The signal from the source electrode of the transistor $T_2$ is then fed back directly to the "−" terminal of the OP1. The OP1 together with T2 is thus a voltage follower. The voltage follower OP1 and T2 make the voltage $V_1{}'$ at node 2 locked to follow with the input voltage $V_1$. Since for an ideal operational amplifier is concerned, the input resistance is almost infinite large. Even though the OP1 is not an ideal one, the feedback current can still be neglected while comparing with the reference current $I_2$. Consequently, the current flow $I_2$ is determined with $V_1{}'/R_2$, and thus $V_1/R_2$.

The transistor $Q_2$ has the same gate bias as the transistor $Q_1$. As a result, if a ratio of the channel width over the channel length $(W/L)_2$ of the transistor $Q_2$, is the same as that of $(W/L)_1$ of the $Q_1$, the mirror current $I_3$ through transistor $Q_2$ would be equal to the current $I_2$ through the transistor $Q_1$. Certainly, the $(W/L)_1$ ratio of the $Q_1$ may be designed to adjust the $(W/L)_2$ ratio of the $Q_2$ according to the relationship of the $I_3/I_2=(W/L)_2/(W/L)_1$ so that $I_3/I_2=n$ results from $(W/L)_2/(W/L)_1=n$.

Since the current through the node 3 to the input terminal "+" of the OP2 can be ignored while comparing to the charging current to the capacitor $C_1$. Thus, all the current through the transistor $Q_2$ is to charge the capacitor $C_1$ and develop a voltage $V_2$. A DC constant current source 8 is required for setting up the DC operating points of the filter circuit, however, the DC current value is not critical at all.

The OP2 together with the transistor T1 is a voltage follower, as a result, the voltage $V_2{}'$ at node 4 is equal to and has the same phase as the voltage $V_2$ at the node 3. Since the voltage $V_2$ at node 3 lags current $I_3$ by $\pi/2$ radian owing to the characteristic of the capacitor, and still the voltage $V_3$ at node 3 is behind the voltage $V_1$ at the node 1 by $\pi/2$ radian. Consequently, the voltage $V_2{}'$ is behind the voltage $V_1$ by $\pi/2$ radian too. The voltage $V_2{}'$ provides current $I_1$ through the resistor $R_1$. In other words, the current $I_1$ comes after the voltage $V_1$ at the node 1 by $\pi/2$ radian. In short, the circuit shown in FIG. 1 represents an equivalent inductor $L_{eq}$.

The value of the equivalent inductor $L_{eq}$ is dependent on the resistors $R_1$ and $R_2$ and capacitor $C_1$.

$I_1=V_2{}'/R_1=V_2/R_1$, where $V_2=I_3/(j\omega C_1)$, where $j=\sqrt{-1}$,

And $I_3=nI_2=nV_1{}'/R_2=nV_1/R_2$, so that $I_1=nV_1/j\omega R_1 R_2 C_1$

Figure 1A:
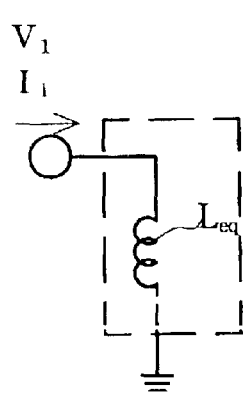
FIG. 1A is a corresponding inductor equivalent circuit of FIG. 1.
Figure 1B:
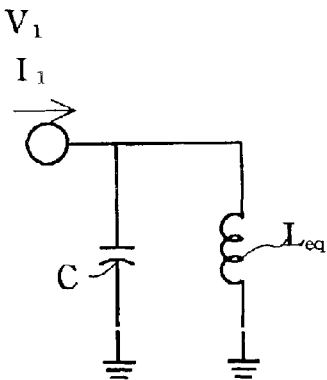
FIG. 1B shows an LC filter or an oscillator, wherein L is a simulated inductor.

In other words, the impedance of the inductor $Z_{eq}$ is $Z_{eq}=V_1/I_1=(j\omega C_1)R_1R_2/n$, $L_{eq}=C_1R_1R_2/n$, since $Z_{eq}=j\omega L_{eq}$, $L_{eq}=C_1R_1R_2/n$, The equivalent circuit according to the first preferred embodiment is shown in FIG. 1A. The current $I_1$ is through the inductor $L_{eq}$ thereto be ground. An example of the usage of the equivalent circuit incorporating a capacitor to constitute a LC filter or oscillator circuit is shown in FIG. 1B.

Figure 2:
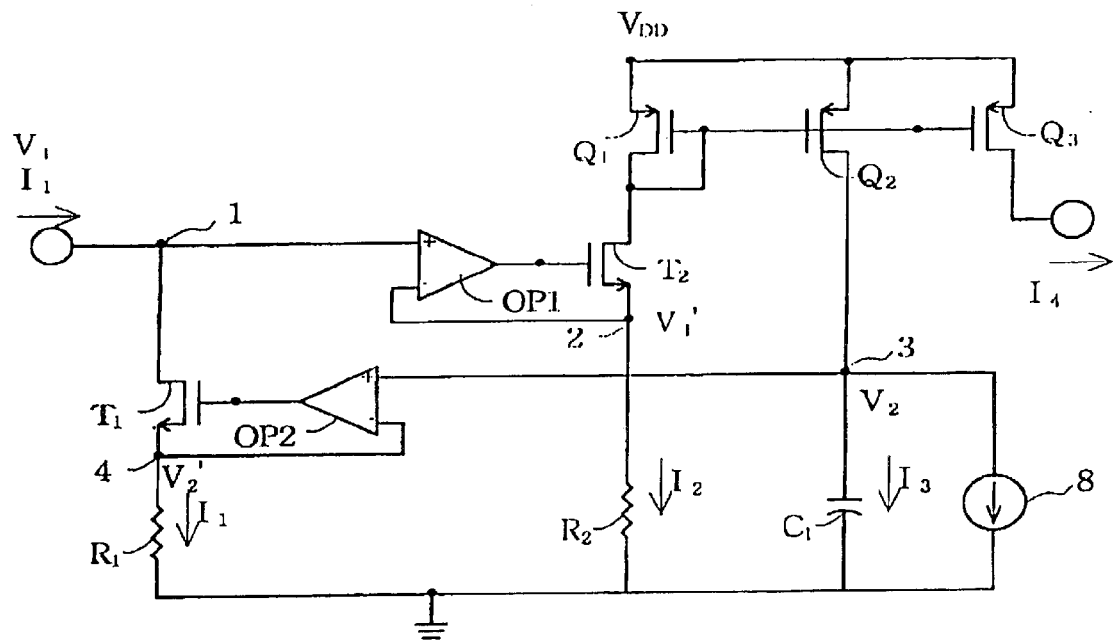
FIG. 2 shows a schematic drawing of simulated LC filter circuit having output terminal thereto cascade with next filter stage according to the second preferred embodiment of the present invention.
Figure 2A:
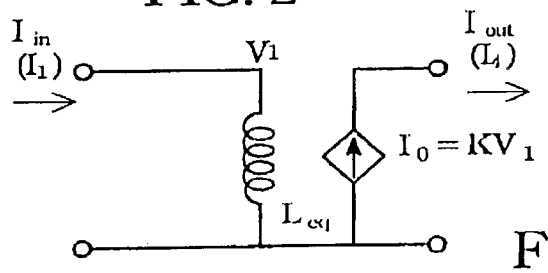
FIG. 2A is a corresponding inductor equivalent LC filter circuit according to the second embodiment of the present invention.

The second preferred embodiment is to extend the practical usage of the first preferred embodiment for multi-stage cascading. The schematic circuit is shown in FIG. 2. As forgoing descriptions, the current $I_2$ is proportional to the input voltage. In views of the properties, the circuit shown is almost the same as the first preferred embodiment except the current mirror circuit. In FIG. 2, an extension portion, the transistor $Q_3$ is added to the current mirror circuit. A ratio of channel width/channel length of the $Q_3$ has a relationship with that of $Q_1$ by $(W/L)_3/(W/L)_1=m$ is assumed, where m is an arbitrary positive real number. Unlike the circuit in FIG. 1 the circuit In FIG. 2 can provide an output current $I_4$ to the next stage. The equivalent circuit is shown in FIG. 2A, where K is a constant. The following relationships are developed:

$I_4=m(V_1{}'/R_2)=m(V_1/R_2)$, or $I_4=KV_1$, where $K=m/R_2$,

Still since $V_1=(j\omega C_1)I_1R_1R_2)/n$,

So $I_4=j\omega(m/n)C_1R_1I_1$ is resulted.

Figure 2B:
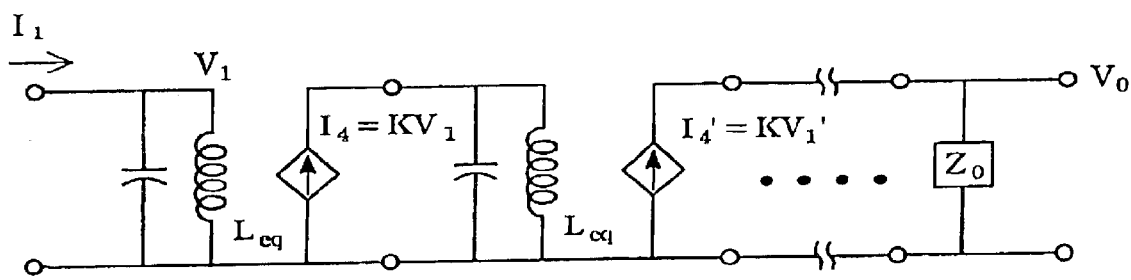
FIG. 2B is a cascading application of FIG. 2A.

In other words, the current $I_4$ leads current $I_1$ by $\pi/2$ radian. The $I_4$ is in phase with the voltage $V_1$ and is proportional to $V_1$ too. The current $I_4$ can provide an input current to the next stage. An example of application of multistage band-pass filter circuit is shown in FIG. 2B. Each of the inductors together with the voltage controlled current sources can be replaced with the aforementioned inductor equivalent circuit.

Figure 3:
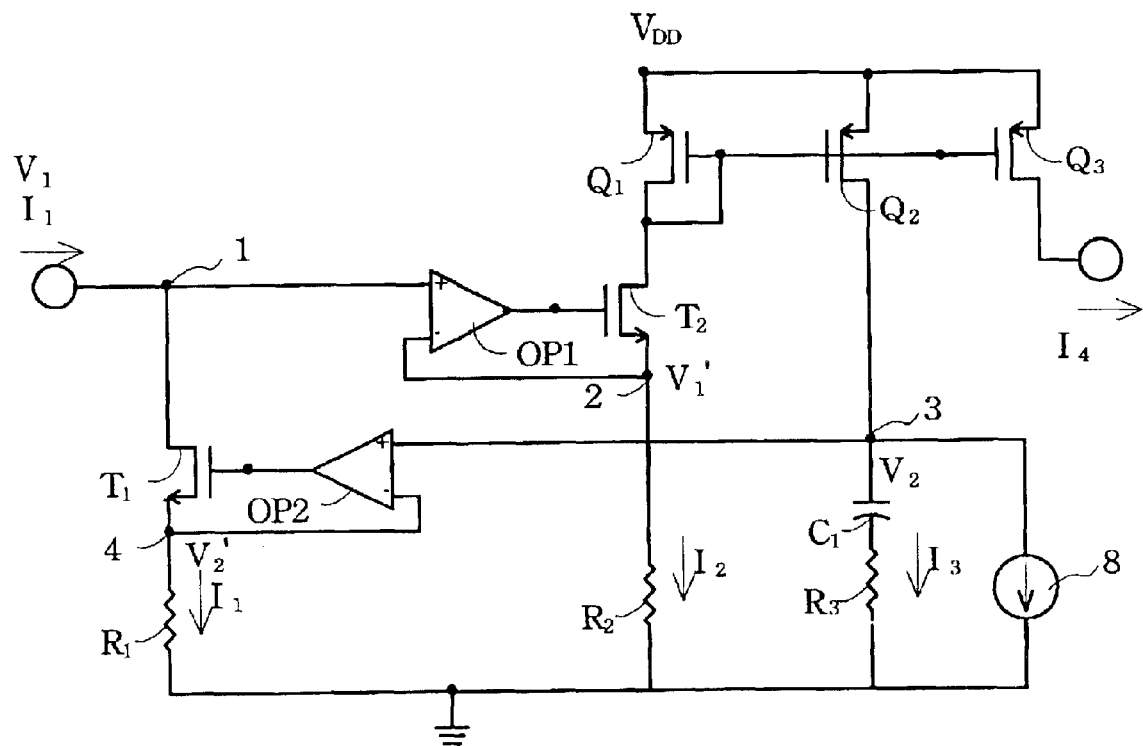
FIG. 3 shows a schematic drawing of simulated LC filter circuit having output terminal thereto cascade with next filter stage according to the third preferred embodiment of the present invention. The circuit includes a damping resistor to stable the circuit and prevent it from becoming an oscillator, and also for applications with lower Q-value.

The third preferred embodiment according to the present invention is shown in FIG. 3. The circuit shown in FIG. 3 is quite similar to the circuit in FIG. 2 except a resistor $R_3$ which connects with the capacitor $C_1$. The resistor $R_3$ is to prevent the equivalent inductor circuit from acting as an oscillator due to too small damping of the capacitor $C_1$ and simulated inductor. The oscillator circuit is difficult to handle owe to its positive feedback. The resistor $R_3$ provides a damping factor. It, however, results in degrading the quality factor Q, but multistage band pass circuits could compensate this disadvantage.

Figure 4:
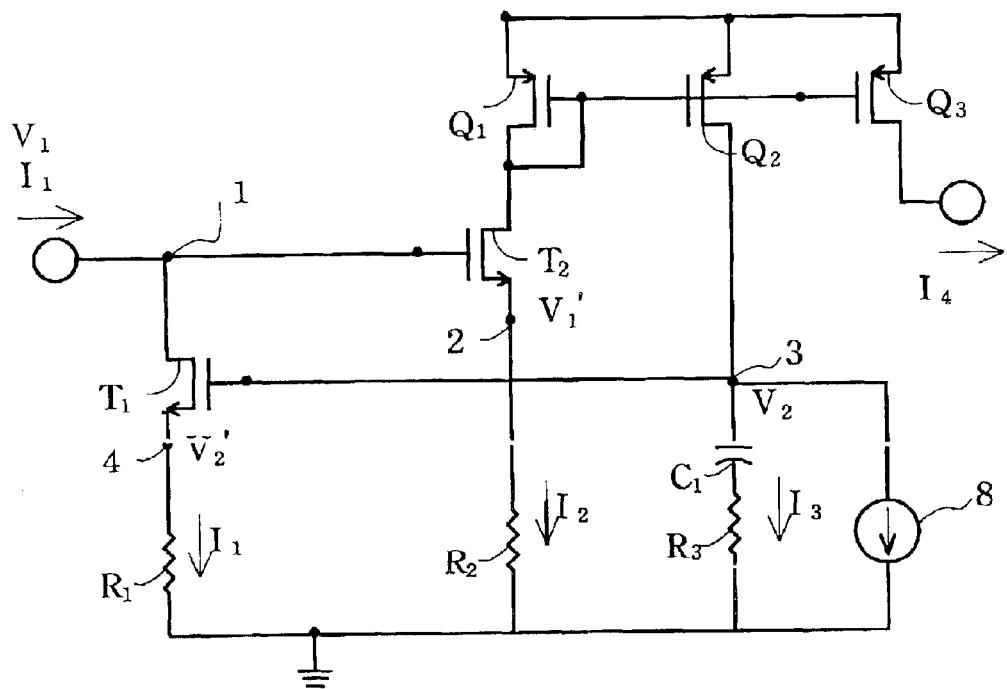
FIG. 4 shows a schematic drawing of simulated LC filter circuit having output terminal thereto cascade with next filter stage according to the fourth preferred embodiment of the present invention. The circuit eliminates two operational amplifiers.
Figure 5:
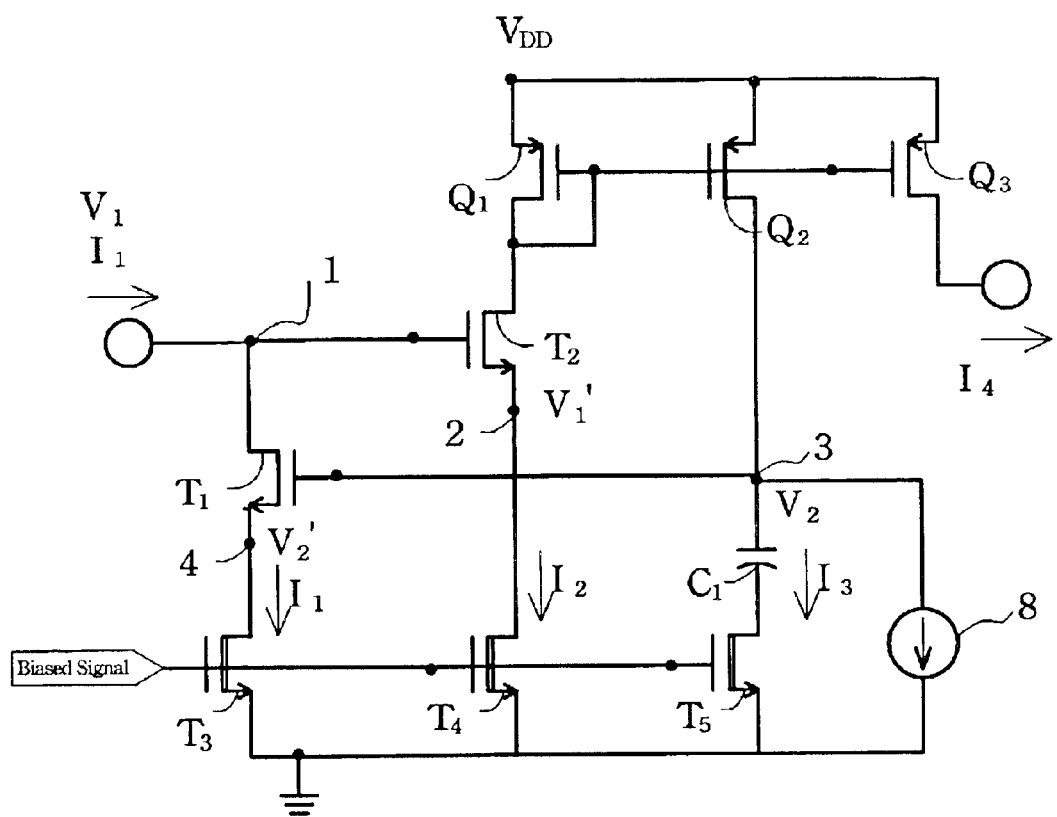
FIG. 5 shows a schematic drawing of simulated LC filter circuit according to the fifth preferred embodiment, where T3, T4, T5 are biased to operate in Ohmic region.

The fourth preferred embodiment is shown in FIG. 4. The circuit is a simplicity version of the previous embodiment. The circuit, skip the OP1, the voltage age $V_1'$ at node 2 differ from input voltage $V_1$ by Vgs, a voltage of the gate to the source electrode. For DC (direct current) component, the voltage $V_1'$ is not the same as $V_1$, however, their AC (alternative current) components are the same where $g_m$ is the transconductance of $T_2$ if the resistance of the resistor $R_2$ is large enough such that $R_2 \gg 1/g_m$, where $g_m$ is the transconductance of $T_2$. Similarly, the AC component of voltage $V_2'$ at the node 2 is approximate the same as that of the voltage $V_2$. Therefore, the performance of the circuit in FIG. 3 is similar or slightly inferior in desertion to the third preferred embodiment's, however it is much simple and applicable to higher frequency band due to omit two operational amplifiers.

The fifth preferred embodiment is an extension usage of the fourth preferred embodiment. Transistors $T_3$, $T_4$, and $T_5$ are used for replacing resistors $R_1$, $R_2$, and $R_3$ of the previous circuit. The transistors $T_3$, $T_4$, and $T_5$ together acts as a mirrored equivalent resistor set. Please refer to U.S. patent application Ser. No. 09/1101283. Hereinto incorporate as reference. A bias signal is to control the gate voltage of the transistors $T_3$, $T_4$, and $T_5$. Preferably, they are depleted type metal oxide semiconductor field effect transistors (MOSFETs) operate at transistor turn-on linear region (or called ohmic region). In the linear region, the behavior of the transistor is like as a resistor, However, the resistance in the mirror equivalent resistor set can be consistently adjusted through the gate bias signal. Particularly, for the multistage filter circuit, the benefits are significantly.

Although the preferred embodiments have been described in some detail, the present invention is not limited therein, other modifications and alternations without departing from the spirit a scope of the present invention should be construed by the appended claim.

What is claimed is:

1. An inductor equivalent circuit comprising:
   a first resistor $R_1$ having one terminal connected to ground;
   a second resistor $R_1$ having one terminal connected to ground;
   a first capacitor $C_1$ having one terminal connected to ground;
   a first transistor having a drain terminal coupling with an input signal and a source terminal coupling with said first resistor $R_1$;
   a second transistor having a source terminal coupling with said second resistor $R_2$ and a gate terminal coupling said input signal;
   a current mirror having a third transistor and a fourth transistor and having gate terminals thereof connecting to a drain terminal of said third transistor to provide a reference current and a mirror current through said fourth transistor, and said fourth transistor having a drain terminal coupling with said capacitor,
   a direct current source in parallel with said capacitor; and
   thus constructing an equivalent inductor with a value about $C_1R_2R_1/n$, wherein said n is a ratio of $(W/L)_4/(W/L)_3$, where $(W/L)_4$ is the channel width over the channel length of said fourth transistor and $(W/L)_3$ is the channel width over the channel length of said third transistor.

2. The inductor equivalent circuit of claim 1, further comprises a first operational amplifier having an output terminal coupled with said gate terminal of said second transistor, and having a first input terminal coupled with said input signal and a second input terminal coupled with said source terminal of said second transistor.

3. The inductor equivalent circuit of claim 1, wherein said third transistor and fourth transistor belong to a p type MOS transistor and said first transistor and second transistor belong to an n type MOS transistor.

4. The inductor equivalent circuit of claim 1, further comprises a second operational amplifier having an output terminal coupled with said gate terminal of said first transistor, and having a first input terminal coupled with said drain terminal of said fourth transistor, and a second input terminal coupled with said source terminal of said first transistor.

5. The inductor equivalent circuit of claim 1, further comprises a fifth transistor having a gate coupled with said gate terminal of said fourth transistor so that the drain terminal can provide a current output of said inductor equivalent circuit.

6. The inductor equivalent circuit of claim 1, further comprises a damped resistor connect in between said capacitor and ground to stabilize said inductor equivalent circuit.

7. An inductor equivalent circuit comprising:
   a first transistor having a source terminal grounded;
   a second transistor having a source terminal grounded, wherein said first transistor and said second transistor having gates thereof connecting to a gate bias signal, which enables said first transistor and said second transistor to operate at an ohmic region;
   a third transistor having a drain terminal coupling with an input signal and as source terminal coupling with said first transistor;
   a fourth transistor having a source terminal coupling with said second transistor and a gate terminal coupling said input signal;
   a capacitor having one terminal connected to ground;
   a current mirror having a fifth transistor, a sixth transistor, and seventh transistor and having gate terminals thereof connecting to a drain terminal of said fifth transistor to provide a reference current through said fifth transistor and a first mirror current through said sixth transistor, and a second mirror current through said seventh transistor furthermore said sixth transistor having a drain terminal coupling with said capacitor, a direct current source in parallel with said capacitor; and thus constructing an equivalent inductor with a value about $C_1R_2R_1/n$, wherein $R_1$, $R_2$ are equivalent resistances of said first transistor and said second transistor, and wherein said n is a ratio of $(W/L)_4/(W/L)_3$, where $(W/L)_4$ is the channel width over the channel length of said fourth transistor and $(W/L)_3$ is the channel width over the channel length of said third transistor.

8. The inductor equivalent circuit of claim 7, further comprises a first operational amplifier having an output terminal coupled with said gate terminal of said fourth transistor, and having a first input terminal coupled with said input signal and a second input terminal coupled with said source terminal of said fourth transistor.

9. The inductor equivalent circuit of claim 7, further comprises a second operational amplifier having an output terminal coupled with said gate terminal of said third transistor, and having a first input terminal coupled with said source terminal of said third transistor, and a second input terminal coupled with said drain terminal of said sixth transistor.

10. The inductor equivalent circuit of claim 7, further comprises an eighth transistor having a gate terminal coupled with said gate terminal of said second transistor, and said eighth transistor is in between said capacitor and ground to stabilize said inductor equivalent circuit.

11. The inductor equivalent circuit of claim 7, wherein said fifth, said sixth and said seventh transistor belong to a p type MOS transistor and said first, said second, said third, said forth transistor and said eighth transistor belong to a n type MOS transistor.

12. The inductor equivalent circuit of claim 7 wherein said fifth, said sixth and said seventh transistor can have different channel width over the channel length ratio so that said reference current, said first mirror current and said second mirror current are dependent each other.

13. The inductor equivalent circuit of claim 7 wherein said first, said second and said eighth transistor can have the same or different channel width over the channel length ratio, and each of them acts as a resistor and said gate bias signal make them operate in ohmic region.

14. The inductor equivalent circuit of claim 10, wherein said fifth, said sixth and said seventh transistor belong to a p type MOS transistor and said first, said second, said third, said forth transistor and said eighth transistor belong to a n type MOS transistor.

* * * * *

UNITED STATES PATENT AND TRADEMARK OFFICE
CERTIFICATE OF CORRECTION

PATENT NO. : 6,809,616 B2  Page 1 of 1
APPLICATION NO. : 10/342183
DATED : October 26, 2004
INVENTOR(S) : Jing-Meng Liu et al.

It is certified that error appears in the above-identified patent and that said Letters Patent is hereby corrected as shown below:

On the title page, item (73) should read as follows:

--(73) Assignee: Richtek Technology Corp., Hshinchu Hsien (TW)--

Signed and Sealed this

Twelfth Day of August, 2008

JON W. DUDAS
*Director of the United States Patent and Trademark Office*